United States Patent [19]
Blaker et al.

[11] Patent Number: 5,533,065
[45] Date of Patent: Jul. 2, 1996

[54] DECREASING LENGTH TRACEBACKS

[75] Inventors: David M. Blaker, Emmaus, Pa.; Gregory S. Ellard, Forest Park, Great Britain; Mohammad S. Mobin, Whitehall, Pa.

[73] Assignee: AT&T Corp., Murray Hill, N.J.

[21] Appl. No.: 174,933

[22] Filed: Dec. 28, 1993

[51] Int. Cl.⁶ .................................................. H04L 27/06
[52] U.S. Cl. ............................................ 375/341; 371/43
[58] Field of Search .................................. 375/262, 341; 371/22, 37.8, 43–45

[56] References Cited

U.S. PATENT DOCUMENTS

| | | | |
|---|---|---|---|
| 3,789,360 | 1/1974 | Clark, Jr. et al. | 371/43 |
| 4,493,082 | 1/1985 | Cumberton et al. | 371/43 |
| 4,583,078 | 4/1986 | Shenoy et al. | 371/43 |
| 4,748,626 | 5/1988 | Wong | 371/30 |
| 4,777,636 | 10/1988 | Yamasaki et al. | 371/43 |
| 4,797,887 | 1/1989 | Yamasaki et al. | 371/43 |
| 4,868,830 | 9/1989 | Pollara-Bozzola | 371/43 |
| 4,905,317 | 2/1990 | Suzuki et al. | 371/43 |
| 5,159,608 | 10/1992 | Falconer et al. | 371/43 |
| 5,220,570 | 6/1993 | Lou et al. | 371/43 |

FOREIGN PATENT DOCUMENTS

| | | | | |
|---|---|---|---|---|
| 0271984 | 12/1984 | European Pat. Off. | | H04L 1/10 |

*Primary Examiner*—Young T. Tse
*Attorney, Agent, or Firm*—David L. Smith

[57] ABSTRACT

A communication system including a Viterbi decoder for tracing a path through a trellis of individual state information and method of operation are disclosed. The traceback determines a decoded symbol. A matrix of surviving branch data is stored in an array of registers. Operating the system includes initiating a first traceback from a storage register at a first symbol instant. The traceback traces a path back through the trellis a first predetermined number of symbol instants to determine a first decoded symbol. The length of the traceback is changed and another traceback is executed. This process is repeated until all remaining final decoded symbols are decoded. In an alternate embodiment, the traceback length is repreatedly decremented by one less than the constraint length, with each traceback obtaining multiple decoded symbols.

12 Claims, 6 Drawing Sheets

DECREASING LENGTH TRACEBACKS

TECHNICAL FIELD

This invention relates generally to radio transmission such as digital cellular telephony and particularly to decrementing the length of tracebacks in a Viterbi decoder.

BACKGROUND OF THE INVENTION

Time division multiple access encoded information is transmitted in multiple channels per carrier. In accordance with the Group Special Mobile (GSM) standard, there are eight channels per carrier. Each channel is provided a time period for transmission called a transmission burst. Some of the bits in each transmission burst are set aside as training bits for system use.

A Viterbi decoder is a maximum likelihood decoder that provides forward error correction. Viterbi decoders are used to decode a sequence of encoded symbols, such as a bit stream. The bit stream can represent encoded information in a telecommunication system. Such information can be transmitted through various media with each bit (or set of bits) representing a symbol instant. In the decoding process, the Viterbi decoder works back through a sequence of possible bit sequences at each symbol instant to determine which one bit sequence is most likely to have been transmitted. The possible transitions from a bit at one symbol instant, or state, to a bit at a next, subsequent, symbol instant or state is limited. Each possible transition from one state to a next state can be shown graphically and is defined as a branch. A sequence of interconnected branches is defined as a path. Each state can transition only to a limited number of next states upon receipt of the next bit in the bit stream. Thus, some paths survive and other paths do not survive during the decoding process. By eliminating those transitions that are not permissible, computational efficiency can be increased in determining the most likely paths to survive. The Viterbi decoder typically defines and calculates a branch metric associated with each branch and employs this branch metric to determine which paths survive and which paths do not survive.

A branch metric is calculated at each symbol instant for each possible branch. Each path has an associated metric, accumulated cost, that is updated at each symbol instant. For each possible transition, the accumulated cost for the next state is calculated as the lesser of the sum of the branch metric for the possible transitions and the path accumulated cost at the previous state.

While several paths survive the transition from one symbol instant to the next symbol instant, there is only one minimum accumulated cost path from the least of the minimum accumulated costs at a symbol instant, back through the possible branches. Surviving branch data at sequential symbol instants is stored in an array. Identifying the minimum accumulated cost path through the surviving branch data starting with a given symbol instant and extending through previous symbol instants is referred to as a traceback. Typical prior art applications employed a single traceback. The number of symbol instants back through the array that the minimum accumulated cost path extends is the length, or depth, of the traceback. The individual state in the array associated with the minimum accumulated cost at the end of the traceback is translated into the most likely bit to have been transmitted in that symbol instant. This is referred to as a decoded symbol. The longer the traceback length, the greater the accuracy in determining a decoded symbol.

At each symbol instant during the construction of a matrix of surviving branch data, an update operation is followed by a traceback. A latency of symbol instants equal to the traceback length occurs before a valid decoded symbol is obtained. The traceback typically has a fixed length. When the matrix of surviving branch data is complete, it is necessary to obtain the remaining decoded symbols, equal in number to the traceback length, from the matrix. A need remains in the art for a technique to obtain the remaining decoded symbols after the matrix of surviving branch data is complete.

SUMMARY OF THE INVENTION

In accordance with one aspect of the invention, a communication system and a method for tracing a path through an array of storage registers containing surviving branch data is disclosed. The traceback obtains a decoded symbol. The method includes initiating a first traceback from a storage register at a first symbol instant. The traceback traces a path back through the array a first predetermined number of symbol instants to obtain a first decoded symbol. The length of the traceback is changed and another traceback is executed. This process is repeated until all remaining decoded symbols are obtained.

In an alternate embodiment, the traceback length is repeatedly decremented by one less than the constraint length, with each traceback obtaining multiple decoded symbols.

DETAILED DESCRIPTION

Figure 1:
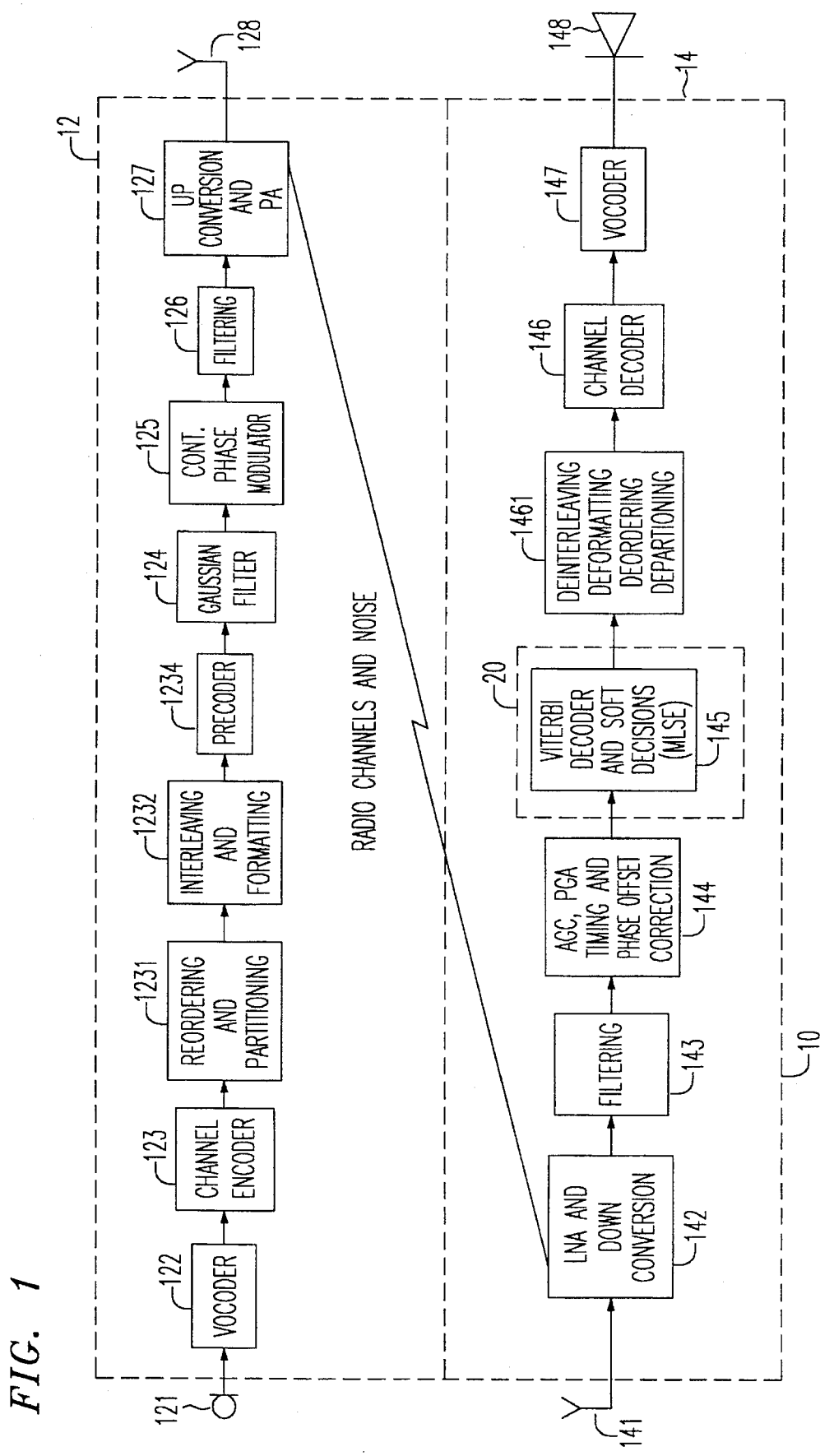
FIG. 1 is a block diagram of a transceiver, in accordance with an illustrative embodiment of the present invention.

Transceiver 10 shown in the block diagram of FIG. 1, is an illustrative embodiment of the invention. Transceiver 10 is a communication system, or portion of a communication system, such as a mobile digital cellular telephone. Transceiver 10 is comprised of a transmitter 12 and receiver 14. Transmitter 12 transmits signals; receiver 14 receives signals for decoding.

As shown in FIG. 1, a microphone 121 for converting a voice signal into an electrical signal is coupled to a vocoder 122. The vocoder is coupled to the channel encoder 123, which includes reordering and partitioning 1231, interleaving and formatting 1232, and precoder 1234. The output of the channel encoder is coupled to a filter 124. The filter output is coupled to a continuous phase modulator 125, which in turn is coupled to another filter 126. Filer 126 is coupled to an up converter and power amplifier which in turn is coupled to an antenna 128.

On the receiver side, antenna 141 is coupled to a low noise amplifier and down conversion 142, which is coupled to filtering 143. Filtering 143 is coupled to automatic gain control 144 which conditions the signal for input to the Viterbi decoder 145. The Viterbi decoder is coupled to a channel decoder 146 which includes deinterleaving, deformating, deordering and departitioning 1461. The channel decoder is coupled to a vocoder 147. The vocoder is coupled to a speaker 148.

Figure 2:
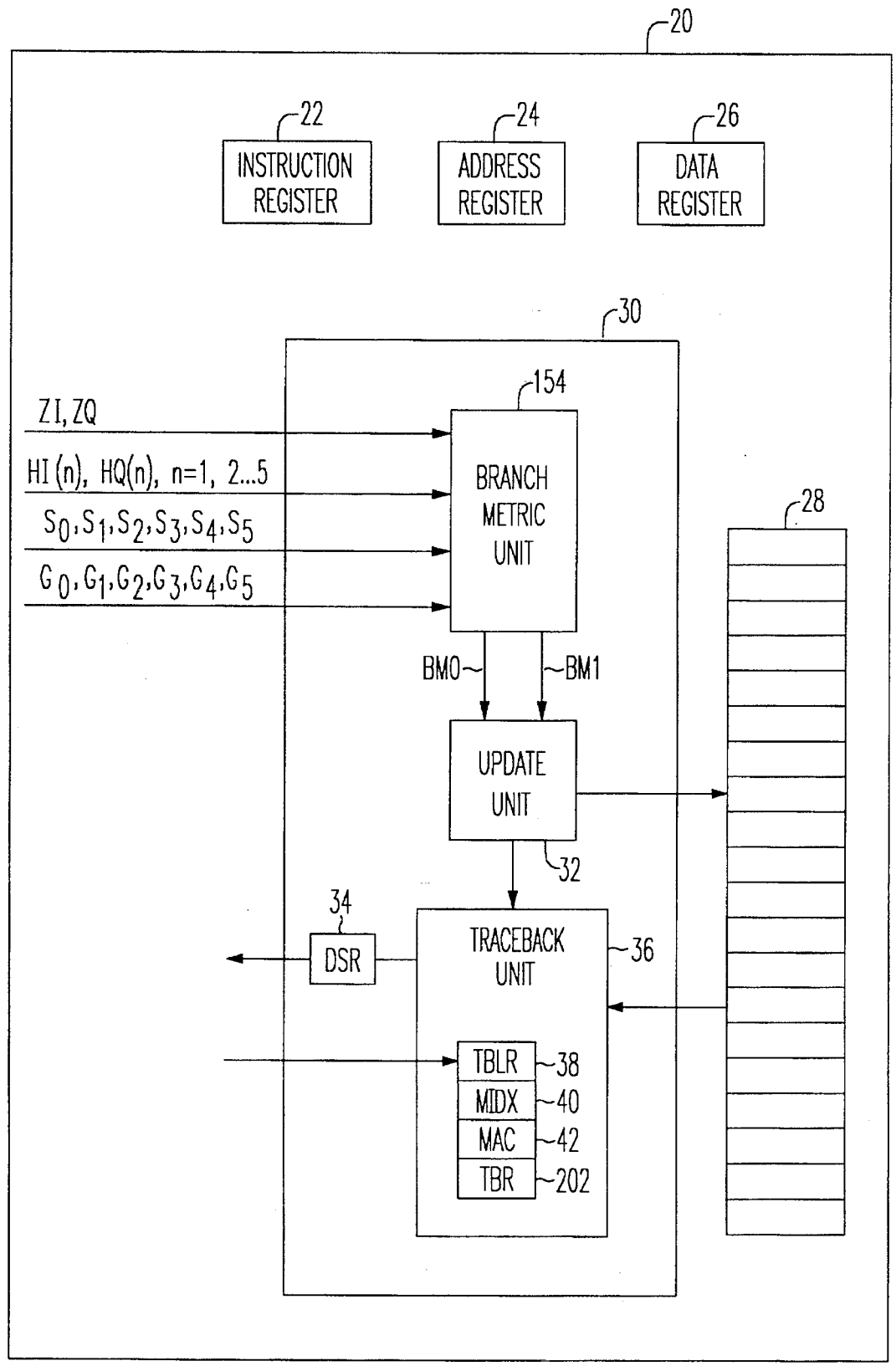
FIG. 2 is a partial block diagram of a transceiver showing digital signal processor having an error correction coprocessor.

FIG. 2 is a partial block diagram of a transceiver 10, shown in more detail. Transceiver 10 includes a digital signal processor (DSP) 20 having an error correction coprocessor 30. Error correction coprocessor 30 may be embedded in DSP 20. Some of the registers of random access memory (RAM) of DSP 20 are allocated as a traceback RAM 28. Alternatively, dedicated RAM could be provided. Traceback RAM 28 may be accessible to both DSP 20 and coprocessor 30.

An indirect addressing technique is used to write data to and read data from the coprocessor 30. To write data to a register at an address in coprocessor 30, an address is written to address register 24 and the data is written to data register 26. The address is transferred from DSP 20 to an address generator in coprocessor 30 and is translated into the address of a corresponding register. To read data from a register at an address in coprocessor 30, an address is written into address register 24 of DSP 20. The address is transferred to the coprocessor 30 and translated to the address of a corresponding register in the coprocessor 30. The data at the addressed coprocessor register is read by reading data register 26 of DSP 20. Instructions are passed to the coprocessor 30 by writing an instruction into the instruction register 22.

In the above manner, the complex received signals ZI and ZQ, complex tap weights HI(n) and HQ(n), n=1, 2 . . . 5, soft symbols $S_0$ through $S_5$ and generating polynomials $G_0$ through $G_5$ are provided as inputs of the branch metric unit 154 within coprocessor 30. The branch metric unit 154 provides two branch metric values, BM0 and BM1, per individual state to update unit 32. The branch metric values are utilized as is known in the art to update the accumulated cost.

Update unit 32 provides to traceback unit 36 the minimum accumulated cost which is stored in the minimum accumulated cost (MAC) register 42. Update unit 32 also provides the address of the register in traceback RAM 28 in which the minimum accumulated cost has occurred, and stores that address in the minimum accumulated cost address (MIDX) register 40.

Traceback unit 36 provides individual state information defining the minimum accumulated cost path through the array of registers, as well as soft decision confidence level in decoded symbols, to traceback RAM 28. At the end of a traceback, update unit 32 also provides a decoded symbol to DSP 20 by way of decoded symbol register (DSR) 34.

Traceback length register (TBLR) 38 is the register in which the traceback length is stored. The traceback length can be changed by over-writing the existing traceback length stored in TBLR 38. In this manner, the traceback length is programmable. A traceback, initiated by a traceback instruction to coprocessor 30 from DSP 20, can be executed with a traceback length that is different than the traceback length of previous or subsequent tracebacks. An update instruction from the DSP causes another cell of traceback RAM to be filled as the array of registers is being filled with surviving branch data. Tracebacks can be executed between two update instructions or even after an update instruction when there are no more symbols to update. Multiple tracebacks may be executed at a single symbol instant.

Figure 3:
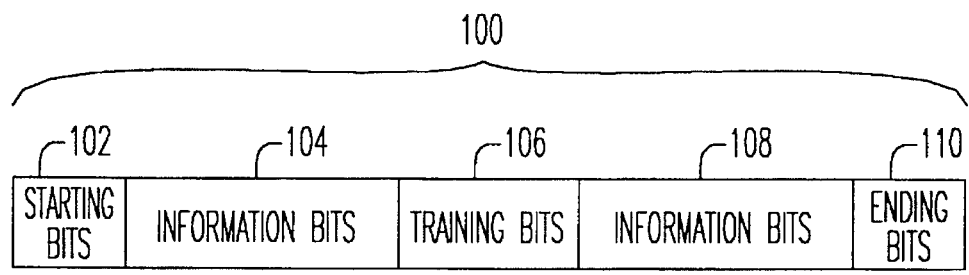
FIG. 3 is an illustration showing the structure of bits in an exemplary transmission burst.

An exemplary frame, or transmission burst, 100 of information transmitted, typically by a base station or mobile digital cellular telephone to the other, is shown in FIG. 3. The transmission burst contains a predetermined number of bits. Each frame includes starting bits 102, a first set of information bits 104, training bits 106, a second set of information bits 108 and ending bits 110. In an exemplary embodiment, there are three starting and ending bits, 58 bits in each set of information bits, and 26 training bits, for a total of 148 bits per frame. The training bits are also known. The starting and ending bits are known and typically are zeros.

Figure 4:
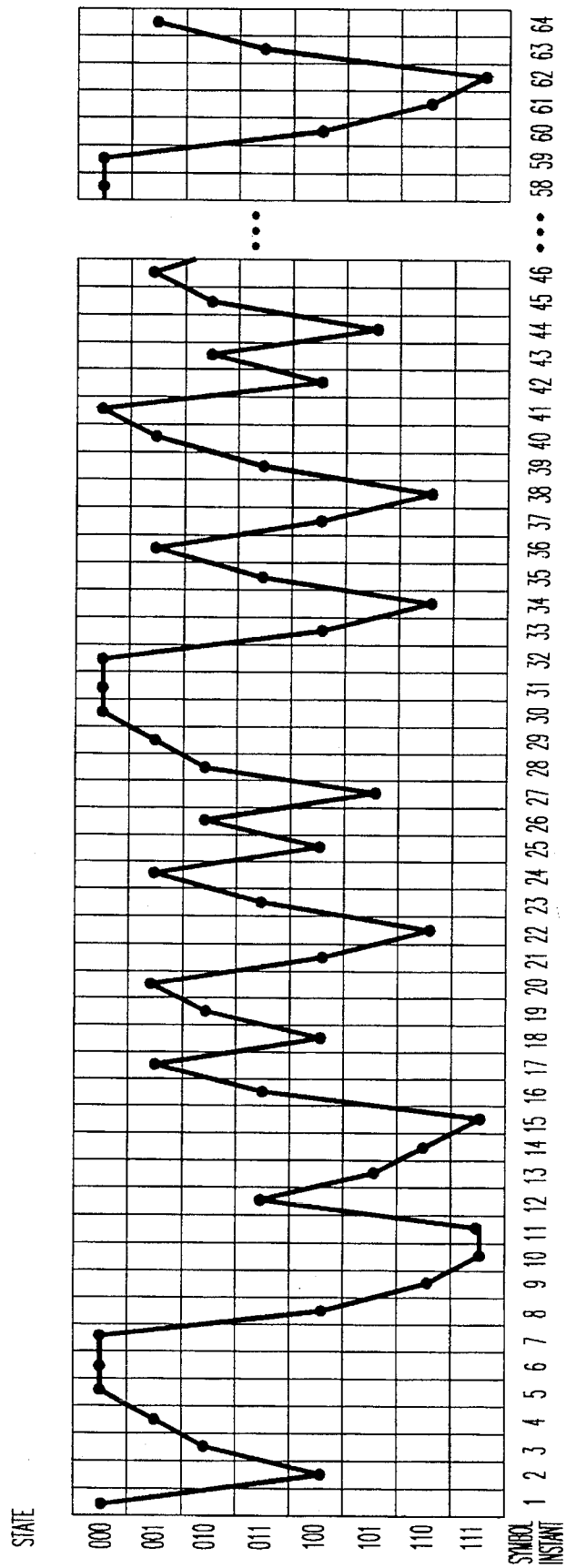
FIG. 4 is a matrix representation of surviving branch data stored in an array of storage registers useful in describing the present invention.

FIG. 4 shows a matrix representation of surviving branch data stored in an array of storage registers, in traceback RAM 28, that is useful in understanding the traceback operation in a Viterbi decoder. A maximum likelihood path that provides the maximum likelihood sequence estimates is shown overlaid on the matrix representation. There are N states or symbol instants (shown horizontally); as an example, FIG. 4 illustrates an N of 64. At each state or symbol instant, there are a number of states (shown vertically) that range from zero up to $2^{C-1} -1$, where C is the constraint length. These states are referred to as individual states. The matrix shown in FIG. 4 is constructed one symbol instant at a time, as is known in the art. The matrix entries at each symbol instant comprise a cell. A single update instruction from DSP 20 to coprocessor 30 initiates an update operation by update unit 32 to produce a cell of matrix entries. At each symbol instant, each individual state of the illustrative embodiment shown in FIG. 4 can only transition to two possible individual states at the next symbol instant. Concomitantly, each individual state at the next symbol instant has only two possible previous individual states from which a transition to it can originate. Other decoders could have more than two transitions to a next state or from a previous state.

A branch metric is calculated at each symbol instant for each possible transition from an individual state at one symbol instant to an individual state at the next symbol instant. Various methods for calculating branch metrics are known in the art. The branch metric of both branches transitioning to a given next individual state are calculated, then added to the accumulated cost of the respective originating individual state. This results in two potential accumulated cost sums. A comparison is made of the two potential accumulated cost sums. An extremum branch metric, such as the lesser of the two sums, is selected as the next state accumulated cost. A transition corresponding to the lesser sum is the more likely transition from the two possible originating individual states to the given next individual state. The originating individual state of the more likely transition is stored in traceback RAM 28 (forming the matrix of FIG. 4) as the surviving branch to the given next individual state, as is known in the art. The lesser sum is the accumulated cost of the next individual state. This process is repeated for each of the next individual states and repeated also for each symbol instant until all of the symbols in the bit stream are decoded.

Traceback RAM 28 can be addressed using modulo addressing. This results in a finite length array appearing to be circular. Consider a traceback of length 60 initiated from symbol instant 30 in an array having 64 symbol instants designated 1 through 64. The traceback starts in symbol instant 30, traces back through symbol instants 29, 28, 27 down through symbol instant 1, symbol instant 64, 63, 62 and so forth until reaching symbol instant 34. At symbol instant 34, the individual state associated with the minimum accumulated cost is translated into a decoded symbol.

The decoded symbol at each symbol instant can be obtained by waiting until the matrix of surviving branch data is complete. Then, starting with the individual state in the last symbol instant having the minimum associated accumulated cost, tracing back through the matrix once. At each symbol instant of this traceback, the originating individual state is translated into a decoded symbol for that symbol instant as is known in the art.

Alternatively at each symbol instant during the construction of the matrix of surviving branch data, a predetermined length traceback operation can be initiated to obtain a decoded symbol at a previous symbol instant. The previous symbol instant will precede the symbol instant at which the traceback is initiated, the present symbol instant, by the traceback length. As the traceback RAM is filled with surviving branch data, DSP 20 alternates instructions between update and traceback. Each update constructs one more cell in the matrix. Each traceback decodes a symbol and provides the decoded symbol to DSP 20 by way of DSR 34. After all updates are complete, the update instruction is omitted and subsequent tracebacks decode the remaining symbols. Each time a symbol instant increases, another traceback operation will provide another decoded symbol.

In this manner, for a constant length traceback, a series of decoded symbols at sequential symbol instants are obtained. The initial tracebacks decode symbols that are considered invalid, and therefore are discarded. After a latency of symbol instants equal to the traceback length the decoded symbols are considered valid.

Figure 5:
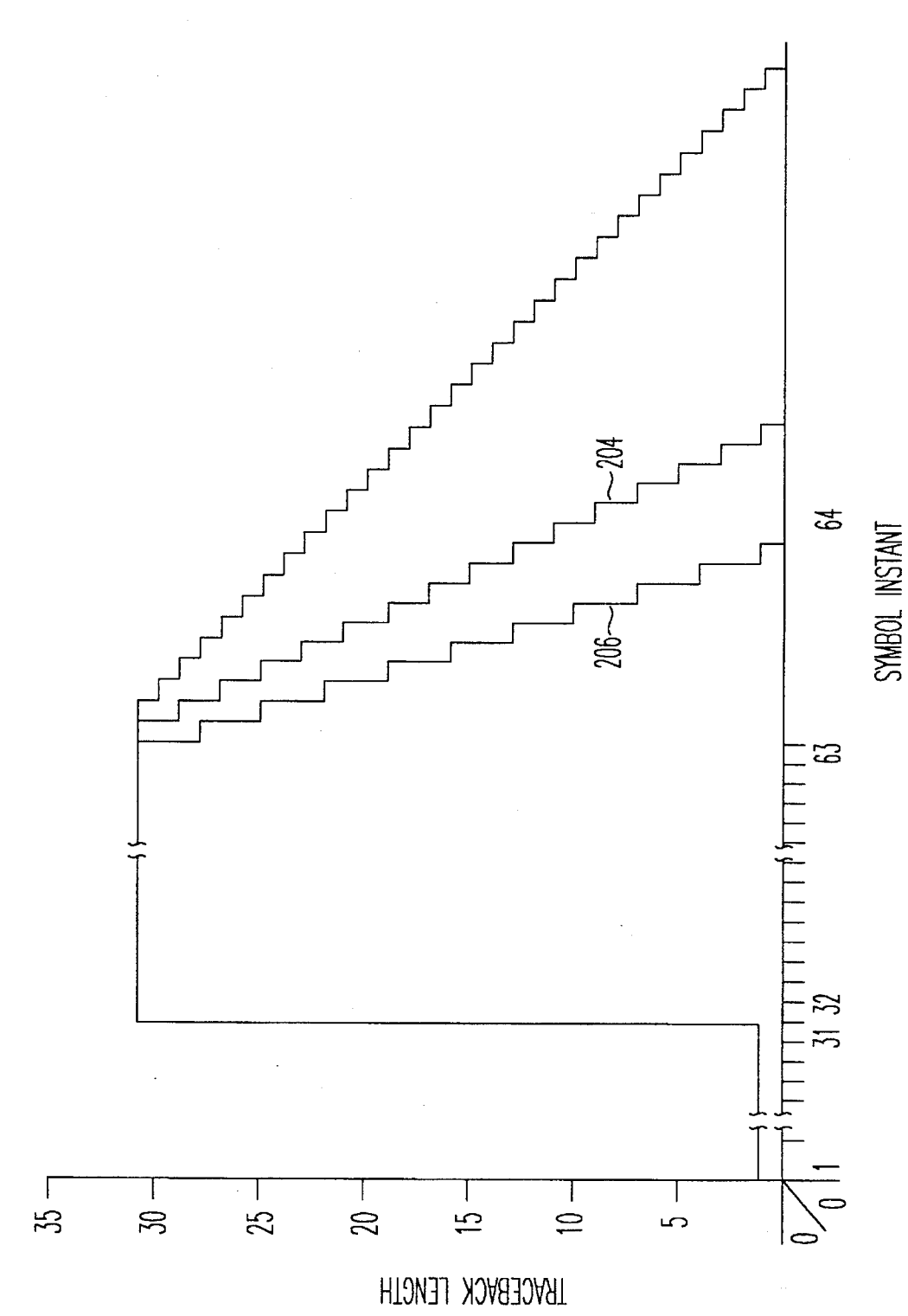
FIG. 5 is an illustration of tracebacks of decrementing lengths, initiated at a single symbol instant.
Figure 7:
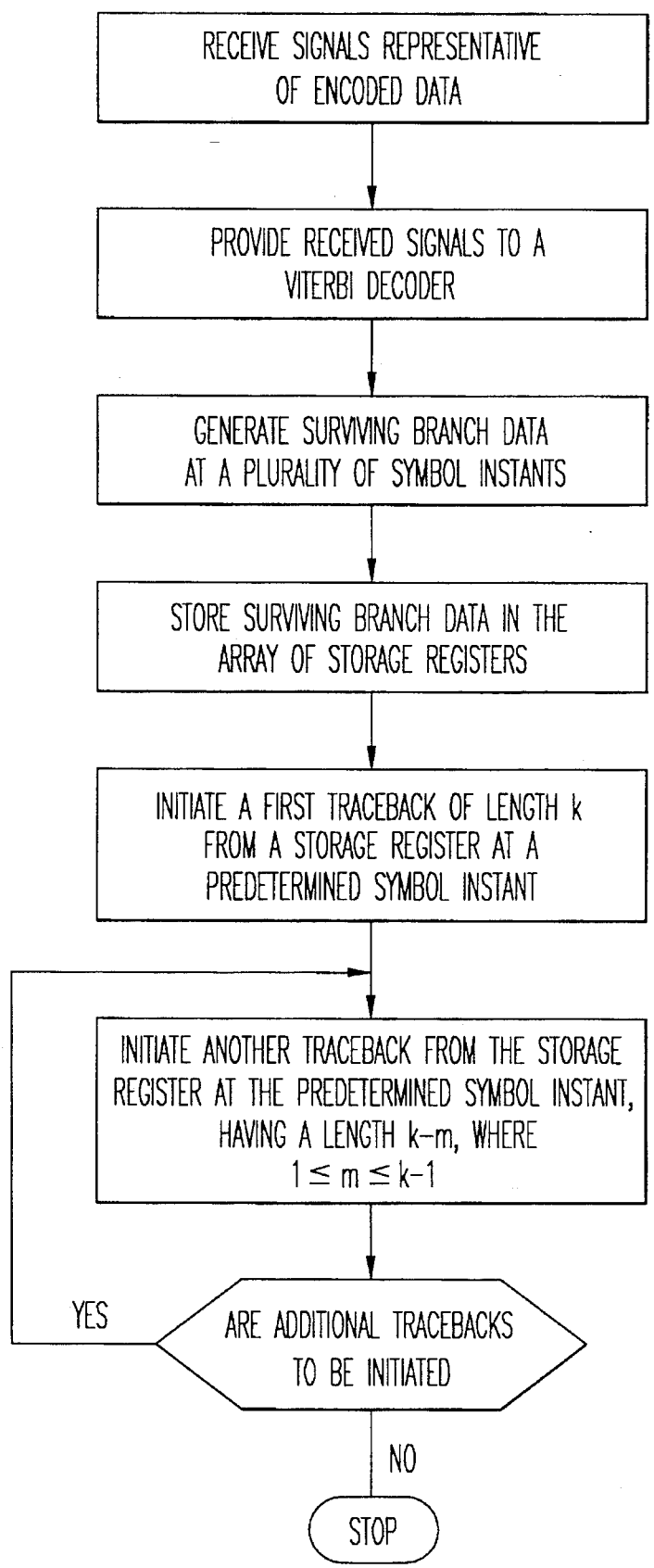
FIG. 7 is a flow diagram of the decreasing length tracebacks.

An example is shown in FIG. 5 in which the traceback length for each symbol instant is shown. A first traceback length is written to traceback length register 38. As the matrix of surviving branch data is formed, a traceback having the first traceback length is executed. A single instruction from DSP 20 to coprocessor 30 initiates a traceback by traceback unit 36. The initial traceback length may very short, for example 1. The traceback may cycle into portions of the trellis having surviving branch data from a previous transmission burst. The decoded symbol at the end of this traceback is typically discarded.

Subsequent tracebacks may be executed having the same traceback length by repeated instructions to the traceback unit. The decoded symbol at the end of each such traceback is typically discarded. Executing a traceback having a very short traceback length where the decoded symbol is discarded minimizes the resources of time and energy expended in generating a symbol that is not used.

At a predetermined symbol instant during construction of the trellis, the traceback length may be changed to a second traceback length. This is achieved by overwriting traceback length register 38 with the second traceback length. Typically, the second traceback length is substantially greater than the first traceback length. Longer traceback lengths provide greater accuracy in determining a decoded symbol. A traceback having a second traceback length is initiated from the predetermined symbol instant.

For example, in symbol instant 32 a traceback of length 31 can be initiated. This traceback results in a final decoded symbol for symbol instant 1. At symbol instant 33 and subsequent symbol instants, the traceback length is either maintained at the second traceback length, or changed to a shorter traceback length. FIG. 5 shows the traceback length maintained at the second traceback length through symbol instant N, here 64.

At each symbol instant a traceback having the second traceback length results in a final decoded symbol as described above. A traceback of length 31 initiated in symbol instant 33 results in a final decoded symbol in symbol instant 2. A traceback of length 31 initiated in symbol instant 34 results in a final decoded symbol in symbol instant 3. This process continues through symbol instant N. After an update instruction at symbol instant 64, the matrix of surviving branch data in traceback RAM 28 is complete. A traceback having a traceback of 31 initiated from symbol instant 64 results in a final decoded symbol in symbol instant 33.

To obtain final decoded symbols for symbol instants 34 through N, the traceback instruction is executed repeatedly. The number of times the traceback instruction is repeatedly executed corresponds to the number of units the traceback length is long, here 31. With each subsequent traceback initiated in symbol instant 64, the traceback length is changed, such as being decremented by one as shown in FIG. 5. The repeated traceback length decrements can be achieved by overwriting the traceback length register 38 or the traceback unit 36 can automatically decrement the traceback length and write the decremented traceback length value to traceback length register 38.

The repeated execution of a traceback instruction can execute various length tracebacks in any order to obtain the remaining final symbols. At symbol instant N, a series of tracebacks are initiated having traceback lengths $$k-m, m=0, 1, 2, \ldots k-1,$$

where k is the second traceback length. Each traceback traces a path back through the matrix array of storage registers of surviving branch data to determine a decoded symbol.

Figure 6:
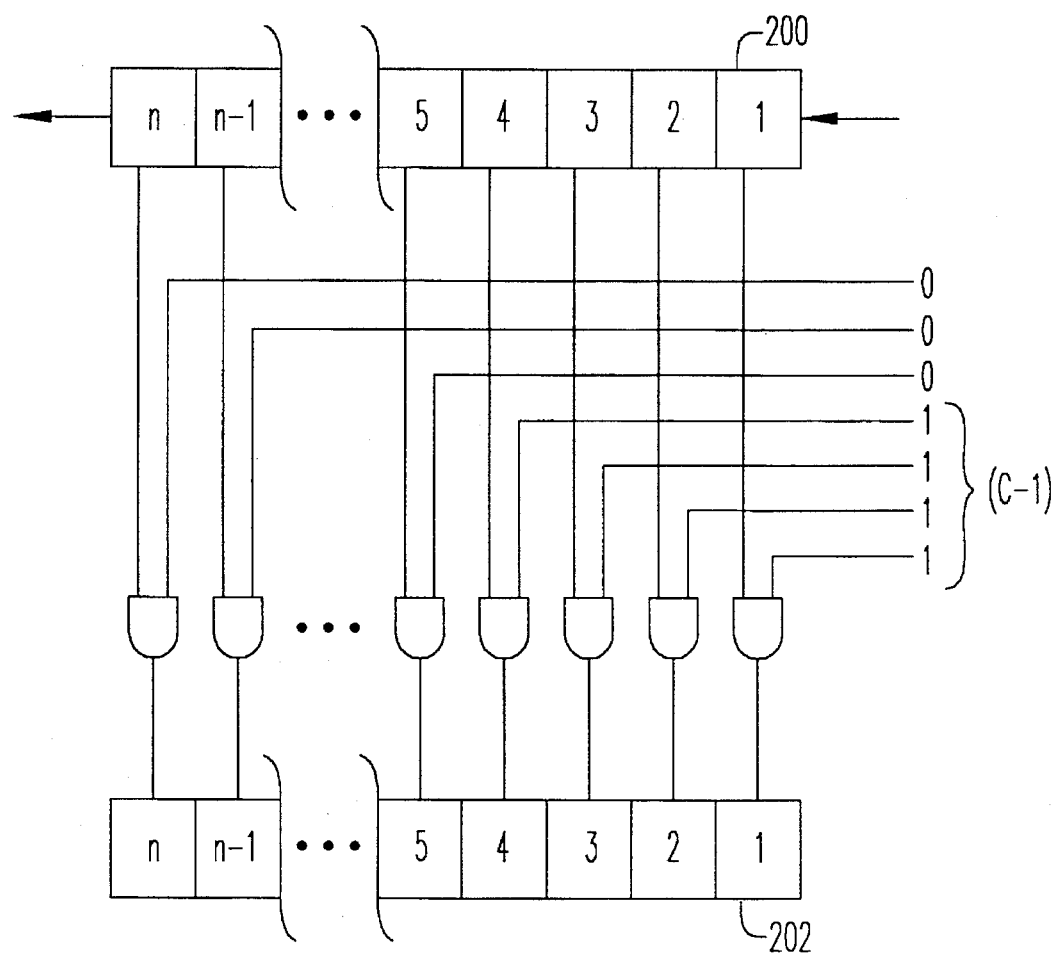
FIG. 6 is an illustration showing a variable length shift register.

Alternatively, the final decoded symbols for symbol instants 34 through N may be obtained without executing a traceback of each length from the second traceback length through one, inclusive. A shift register 200, shown in FIG. 6, is utilized. The number of stages in shift register 200 is n.

At symbol instant N, starting with the address in MIDX 40, a traceback is executed. An exemplary traceback length is 31. The maximum likelihood sequence bit for each symbol instant is sequentially shifted into shift register 200. The last C-1 bits of the maximum likelihood sequence bits are transferred to the traceback register (TBR) 202, fight aligned as shown in FIG. 6. The (n-(c-1)) upper bits of shift register 200 may be masked to zero upon transfer to TBR 202. When these upper bits are not masked to zero, n decoded symbols are transferred to TBR 202, and the traceback length can be decreased by n. The least significant bit in traceback register 202 is the decoded symbol for the previous symbol instant determined by the traceback. In other words, it is the decoded symbol for symbol instant 33. The next bit is the decoded symbol for the next subsequent symbol instant, 34. The third bit is the decoded symbol for symbol instant 35. Other implementations might provide a different order.

The length of the traceback is decremented by (C-1), to 28, and another traceback is executed. This traceback obtains decoded symbols for the next (C-1) symbol instants, 36, 37 and 38. The process is repreated until a decoded symbol has been obtained for all N symbol instants. The last traceback may obtain fewer than (C-1) decoded symbols.

The traceback length can be decremented by overwriting the present traceback length in TBLR 38, or by setting a counter to automatically decrement the traceback length following each traceback.

A benefit of using shift register 200 and traceback register 202 can be seen in FIG. 5 where decreasing the trace back length in steps of two is shown at 204 and steps of three is shown at 206 for comparison to the individual decrement shown without a reference numeral. Fewer tracebacks are required to obtain the decoded symbols for the remaining symbol instants once the array is complete. At symbol instant N, a series of tracebacks can be initiated having traceback lengths k-m, where m can take on values greater than unity, such as c-1 or n.

While exemplary numerical values were used to illustrate the various embodiments of the present invention, the invention is not limited to the numerical values illustrated. Tracebacks of various lengths and sequences are contemplated within the scope of the invention.

While the matrix of registers in traceback RAM 28 has been described as having a length of N units, it is not necessary to retain all N. Once a traceback has been executed and a decoded symbol obtained for a predetermined symbol instant, the surviving branch data in that predetermined symbol instant is of no further value. It is only necessary for the matrix of registers to have a length of the traceback length, plus one register to receive the most recent accumulated cost data.

RAM 28 may contain hard decision or soft decision data. Hard decision data may be stored with sixteen hard decisions per 16 bit word. Soft decisions may be stored with two soft decisions per sixteen bit word.

The invention is particularly useful in communication systems and equipment employing integrated circuits including this technique. Such communications systems and equipment have the advantage of maintaining a long traceback length to provide increased accuracy in the decoding process, then decrementing the traceback length using various techniques until all symbols are decoded.

While the illustrative embodiment of the invention has not been described as incorporating pipelining, one skilled in the art would recognize the enhanced computational efficiency available by utilizing pipelining in the design. Pipelining is achieved by initiating computation with a new data set before completing computations with a previous set of data. The more latches used in pipelining, the greater the depth of pipelining. Pipelining causes an initial latency in computation time required to fill the pipeline, but maximizes usage of resources such as adders and subtracters.

We claim:

1. A method of operating a communication system comprising a receiver, the receiver for receiving signals, the method for tracing a path through an array of surviving branch data from various symbol instants to obtain a decoded symbol, the surviving branch data stored in an array of storage registers, the array of storage registers having one dimension determined by a constraint length, the method comprising the steps of:

receiving signals representative of encoded data;

providing the received signals to a Viterbi decoder;

generating the surviving branch data at a plurality of symbol instants based on the received signals;

storing the surviving branch data in storage registers of the array of storage registers;

initiating a first traceback of length k from a storage register at a predetermined symbol instant, the first traceback tracing a path back through the surviving branch data in the array of storage registers of the surviving branch data to obtain a first decoded symbol; and initiating another traceback from the storage register at the predetermined symbol instant, said another traceback having a length of
    k-m, where: k is the length of the first traceback; and $1 \leq m \leq k-1$ said another traceback tracing a path back through the array of storage registers of the surviving branch data to obtain another decoded symbol.

2. The method as recited in claim 1, wherein the step of initiating another traceback is repeated with m taking on a different value in the range $1 \leq m \leq k-1$.

3. The method as recited in claim 2, wherein m is changed by one less than the constraint length.

4. The method as recited in claim 2 wherein m is changed by a value selected from the group consisting of 1, 2, 3, 4, 5, and 6.

5. A method of operating a digital communication system comprising a receiver, the receiver for receiving signals, the method for tracing a path through an array of surviving branch data from various symbol instants to determine a decoded symbol, the array stored in an array of storage registers, the method comprising the step of:

receiving signals representative of encoded data;

providing the received signals to a Viterbi decoder;

generating the surviving branch data at a plurality of symbol instants based on the received signals;

storing the surviving branch data in the array of storage registers;

initiating a series of at least two tracebacks from a predetermined symbol instant, said at least two tracebacks each tracing a path back through the surviving branch data in the array of storage registers of the surviving branch data to obtain a respective decoded symbol, whereby at least two decoded symbols are decoded from the series of at least two tracebacks initiated from the predetermined symbol instant.

6. The method of operating a digital communication system as recited in claim 5, wherein at least two tracebacks have traceback lengths that are consecutive numbers.

7. The method of operating a digital communication system as recited in claim 5, wherein the predetermined symbol instant has a magnitude, and at least one of said series of at least two tracebacks has a traceback length that has a magnitude that is less than the magnitude of the predetermined symbol instant from which said series of at least two tracebacks are initiated.

8. Apparatus for decoding encoded data, comprising:

a Viterbi decoder for receiving the encoded data;

means for generating surviving branch data at a plurality of symbol instants based on the encoded data;

means for storing the surviving branch data in an array of storage registers;

means for initiating a first traceback of length k from a predetermined symbol instant, the first traceback tracing a path back through the array of storage registers of the surviving branch data to obtain a first decoded symbol; and means for initiating from the predetermined symbol instant an additional traceback of length
    k-m, where: k is the length of the first traceback; and $1 \leq m \leq k-1$ the additional traceback tracing a path back through the array of storage registers of the surviving branch data to obtain another decoded symbol.

9. The apparatus as recited in claim 8, further comprising:
means for initiating from the predetermined symbol instant a traceback having a length determined by a different value of m.

10. An integrated circuit for decoding encoded data comprising:
a Viterbi decoder for receiving the encoded data;
means for generating surviving branch data at a plurality of symbol instants based on the encoded data;
random access memory for storing the surviving branch data in an array of storage registers;
means for initiating a first traceback of length k from a predetermined symbol instant, the first traceback tracing a path back through the array of storage registers of the surviving branch data to obtain a first decoded symbol; and
means for initiating from the predetermined symbol instant an additional traceback of length
k−m, where: k is the length of the first traceback; and $1 \leq m \leq k-1$
the additional traceback tracing a path back through the array of storage registers of the surviving branch data to obtain another decoded symbol.

11. The integrated circuit as recited in claim 10, further comprising:
means for initiating from the predetermined symbol instant a traceback having a length determined by a different value of m.

12. A method of operating a digital communication system comprising a receiver, the receiver for receiving signals, the method for tracing a path through an array of surviving branch data from various symbol instants to determine a decoded symbol, the surviving branch data stored in an array of storage registers, the method comprising the step of:
receiving signals representative of encoded data;
providing the received signals to a Viterbi decoder;
generating the surviving branch data at a plurality of symbol instants based on the received signals;
storing the surviving branch data in the array of storage registers;
initiating a series of tracebacks from a predetermined symbol instant, the traceback length of each traceback in the series of tracebacks defined by
k−m, where: k is the length of an initial traceback; and m=1, 2, 3 . . . k−1
each traceback of the series of tracebacks tracing a path back through the array of storage registers of the surviving branch data to obtain a decoded symbol.

\* \* \* \* \*